(12) United States Patent
Zhao et al.

(10) Patent No.: US 11,569,129 B2
(45) Date of Patent: Jan. 31, 2023

(54) WORKPIECE PROCESSING METHOD

(71) Applicant: DISCO CORPORATION, Tokyo (JP)

(72) Inventors: Jinyan Zhao, Tokyo (JP); Yoshiaki Yodo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 117 days.

(21) Appl. No.: 16/918,177

(22) Filed: Jul. 1, 2020

(65) Prior Publication Data
US 2021/0013102 A1  Jan. 14, 2021

(30) Foreign Application Priority Data

Jul. 11, 2019  (JP) .............................. JP2019-129633

(51) Int. Cl.

| | |
|---|---|
| *B23K 26/38* | (2014.01) |
| *H01L 21/301* | (2006.01) |
| *H01L 21/78* | (2006.01) |
| *B23K 26/53* | (2014.01) |
| *B23K 26/57* | (2014.01) |
| *H01L 21/268* | (2006.01) |
| *H01L 21/683* | (2006.01) |

(Continued)

(52) U.S. Cl.
CPC .............. *H01L 21/78* (2013.01); *B23K 26/18* (2013.01); *B23K 26/53* (2015.10); *B23K 26/57* (2015.10); *H01L 21/268* (2013.01); *H01L 21/6836* (2013.01); *B23K 2103/56* (2018.08)

(58) Field of Classification Search
CPC .............. B23K 26/0617; H01L 23/544; H01L 21/02395; H01L 21/02381; H01L 21/78
See application file for complete search history.

(56) References Cited

U.S. PATENT DOCUMENTS 9,165,832 B1 * 10/2015 Papanu ............ H01L 21/67207
2006/0045511 A1    3/2006 Genda
(Continued)

FOREIGN PATENT DOCUMENTS

| JP | 2006073690 A | 3/2006 |
|---|---|---|
| JP | 2014130910 A | 7/2014 |
| WO | 2017216603 A1 | 12/2017 |

OTHER PUBLICATIONS

Office Action issued by the German Patent Office for corresponding German Patent Application No. 10 2020 208 482.3, dated Oct. 6, 2022.

*Primary Examiner* — Brian Turner
(74) *Attorney, Agent, or Firm* — Greer Burns & Crain, Ltd.

(57) ABSTRACT

A workpiece processing method includes holding a workpiece unit on a holding table and forming a division start point. The workpiece unit has a workpiece having a front side and a back side, and an additional member formed on the back side of the workpiece. The additional member is different in material from the workpiece. The workpiece unit is held on the holding table with the additional member opposed to the holding table. The division start point is formed by applying a laser beam to the front side of the workpiece with the focal point of the laser beam set inside the workpiece. The laser beam forms a modified layer inside the workpiece and simultaneously forming a division start point inside the additional member due to the leakage of the laser beam from the focal point toward the back side of the workpiece.

20 Claims, 6 Drawing Sheets

(51) Int. Cl.
*B23K 26/18* (2006.01)
*B23K 103/00* (2006.01)

(56) References Cited

U.S. PATENT DOCUMENTS

| | | | |
|---|---|---|---|
| 2007/0170159 A1* | 7/2007 | Fukumitsu | B28D 5/0011 |
| | | | 219/121.68 |
| 2014/0117505 A1* | 5/2014 | Mackh | H01L 23/562 |
| | | | 257/620 |
| 2015/0151380 A1* | 6/2015 | Hosseini | B23K 26/53 |
| | | | 219/121.72 |
| 2017/0084546 A1* | 3/2017 | Cheong | H01L 21/02378 |
| 2017/0213756 A1* | 7/2017 | Yoshida | H01L 22/12 |
| 2019/0164784 A1* | 5/2019 | Wongratanaporngoorn | |
| | | | H01L 21/67092 |
| 2019/0217420 A1* | 7/2019 | Vanagas | H01S 5/005 |
| 2019/0221479 A1* | 7/2019 | Okita | H01J 37/32403 |
| 2020/0051860 A1* | 2/2020 | Wyant | H01L 21/78 |

\* cited by examiner

WORKPIECE PROCESSING METHOD

BACKGROUND OF THE INVENTION

Field of the Invention

The present invention relates to a workpiece processing method.

Description of the Related Art

In the case of dividing a workpiece and a DAF (Die Attach Film) attached to the back side of the workpiece, the workpiece is first divided, and the DAF is next divided by a known technique (see Japanese Patent Laid-Open No. 2014-130910). Further, in the case of dividing a workpiece and a metal film formed on the back side of the workpiece, the workpiece is first divided, and the metal film is next divided by a known technique (see Japanese Patent Laid-Open No. 2006-073690).

SUMMARY OF THE INVENTION

However, in the techniques described in Japanese Patent Laid-Open No. 2014-130910 and Japanese Patent Laid-Open No. 2006-073690, the workpiece and the DAF or the metal film are separately divided in two steps, so that there is a problem such that the efficiency of division of the workpiece and the DAF or the metal film is low.

It is therefore an object of the present invention to provide a workpiece processing method which can efficiently divide a workpiece and an additional member formed on the back side of the workpiece, the additional member being different in material from the workpiece.

In accordance with an aspect of the present invention, there is provided a workpiece processing method for processing a workpiece unit composed of a workpiece having a front side and a back side opposite to the front side and an additional member formed on the back side of the workpiece, the additional member being different in material from the workpiece, the workpiece processing method including a holding step of holding the workpiece unit on a holding table in a condition where the additional member of the workpiece unit is opposed to the holding table, and a division start point forming step of applying a laser beam to the front side of the workpiece of the workpiece unit in a condition where the focal point of the laser beam is set inside the workpiece after performing the holding step, the laser beam having a transmission wavelength to the workpiece, thereby forming a modified layer inside the workpiece and simultaneously forming a division start point inside the additional member due to the leakage of the laser beam from the focal point toward the back side of the workpiece.

Preferably, the workpiece processing method of the present invention further includes an attaching step of attaching the front side of the workpiece to an expandable tape after performing the division start point forming step, and a dividing step of expanding the expandable tape to thereby divide the workpiece and the additional member along the modified layer and the division start point at one time.

Preferably, the additional member includes a die attach film. Alternatively, the additional member includes a metal film.

According to the present invention, it is possible to efficiently divide the workpiece unit composed of the workpiece and the additional member formed on the back side of the workpiece, the additional member being different in material from the workpiece.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment described below. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
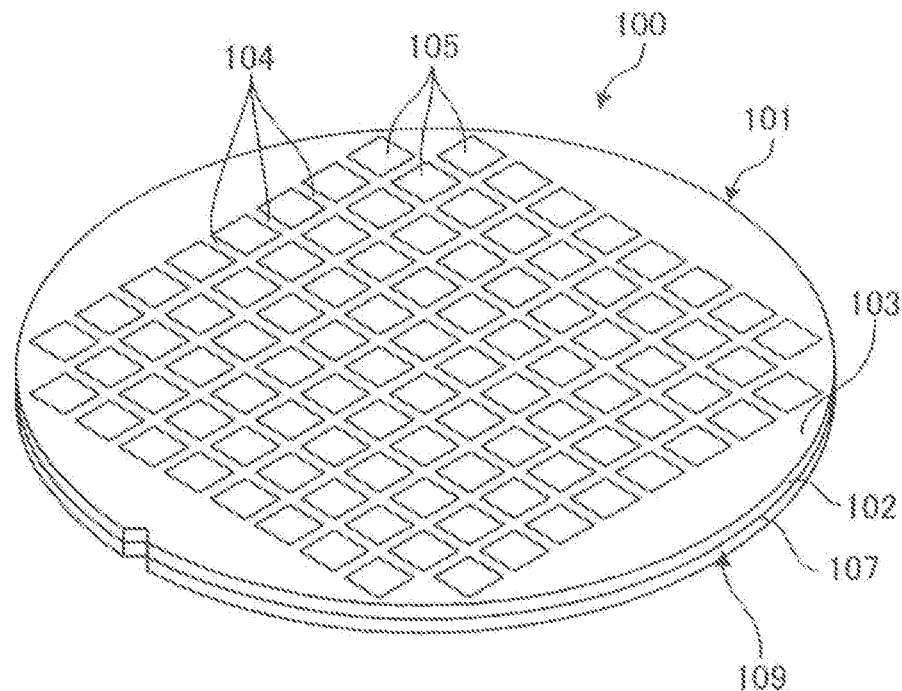
FIG. 1 is a perspective view of a workpiece unit including a workpiece, in which the workpiece unit is a target to be processed by a workpiece processing method according to a preferred embodiment of the present invention.

A workpiece processing method according to a preferred embodiment of the present invention will now be described with reference to the drawings. There will first be described a target to be processed by the workpiece processing method according to this preferred embodiment. FIG. 1 is a perspective view of a workpiece unit 100 including a workpiece 101, in which the workpiece unit 100 is a target to be processed by the workpiece processing method according to this preferred embodiment. In FIG. 1, a plurality of devices 105 are formed on the workpiece 101, and each device 105 is schematically depicted so as to be larger in scale as compared with the workpiece 101 and the workpiece unit 100 for convenience of illustration. Also in the other drawings, the scale of each component is not always an actual scale.

The workpiece unit 100 as a target to be processed by the workpiece processing method according to this preferred embodiment essentially includes the workpiece 101 and an additional member 109 different in material from the workpiece 101. The workpiece 101 has a front side 103 and a back side 107 opposite to the front side 103. The additional member 109 is formed on the back side 107 of the workpiece 101. In this preferred embodiment, both the workpiece 101 and the additional member 109 are disk-shaped members having the same diameter. However, the workpiece 101 and the additional member 109 are not limited in shape and size in the present invention. For example, both the workpiece 101 and the additional member 109 may be disk-shaped members having different diameters. In other words, one of the workpiece 101 and the additional member 109 may have a diameter larger than that of the other. Further, both the workpiece 101 and the additional member 109 may be polygonal members.

As depicted in FIG. 1, the workpiece 101 in this preferred embodiment is a disk-shaped semiconductor wafer or optical device wafer including a substrate 102 and a plurality of devices 105 formed on the substrate 102. The substrate 102 is formed of silicon, sapphire, gallium arsenide, or silicon carbide (SiC), for example. A plurality of crossing division lines 104 are formed on the front side 103 of the substrate 102 to thereby define a plurality of separate regions where the plural devices 105 are individually formed. In this preferred embodiment, the crossing division lines 104 are composed of a plurality of parallel division lines 104 extending in a first direction and a plurality of parallel division lines 104 extending in a second direction perpendicular to the first direction.

In this preferred embodiment, the additional member 109 is a DAF (Die Attach Film) attached to the back side 107 of the workpiece 101 or a metal film formed on the back side 107 of the workpiece 101. However, the additional member 109 is not limited to a DAF or a metal film in the present invention. The DAF as an example of the additional member 109 is a member for fixing each of the individual devices 105 (device chips) divided from the workpiece unit 100 to another device chip or another substrate, for example. The DAF is a ductile member capable of being expanded and contracted. The metal film as another example of the additional member 109 is an electrode or heat sink for each device 105 (device chip).

The workpiece unit 100 is divided along each division line 104 to obtain the individual devices 105 (individual device chips) in a condition where the additional member 109 is attached to each device 105 (device chip). That is, both the workpiece 101 and the additional member 109 attached thereto are divided together along each division line 104.

Figure 2:
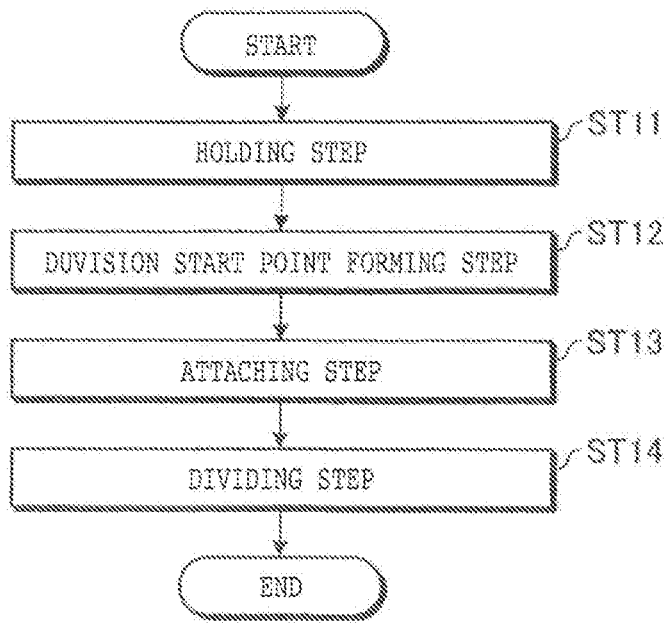
FIG. 2 is a flowchart depicting the workpiece processing method according to this preferred embodiment.
Figure 3:
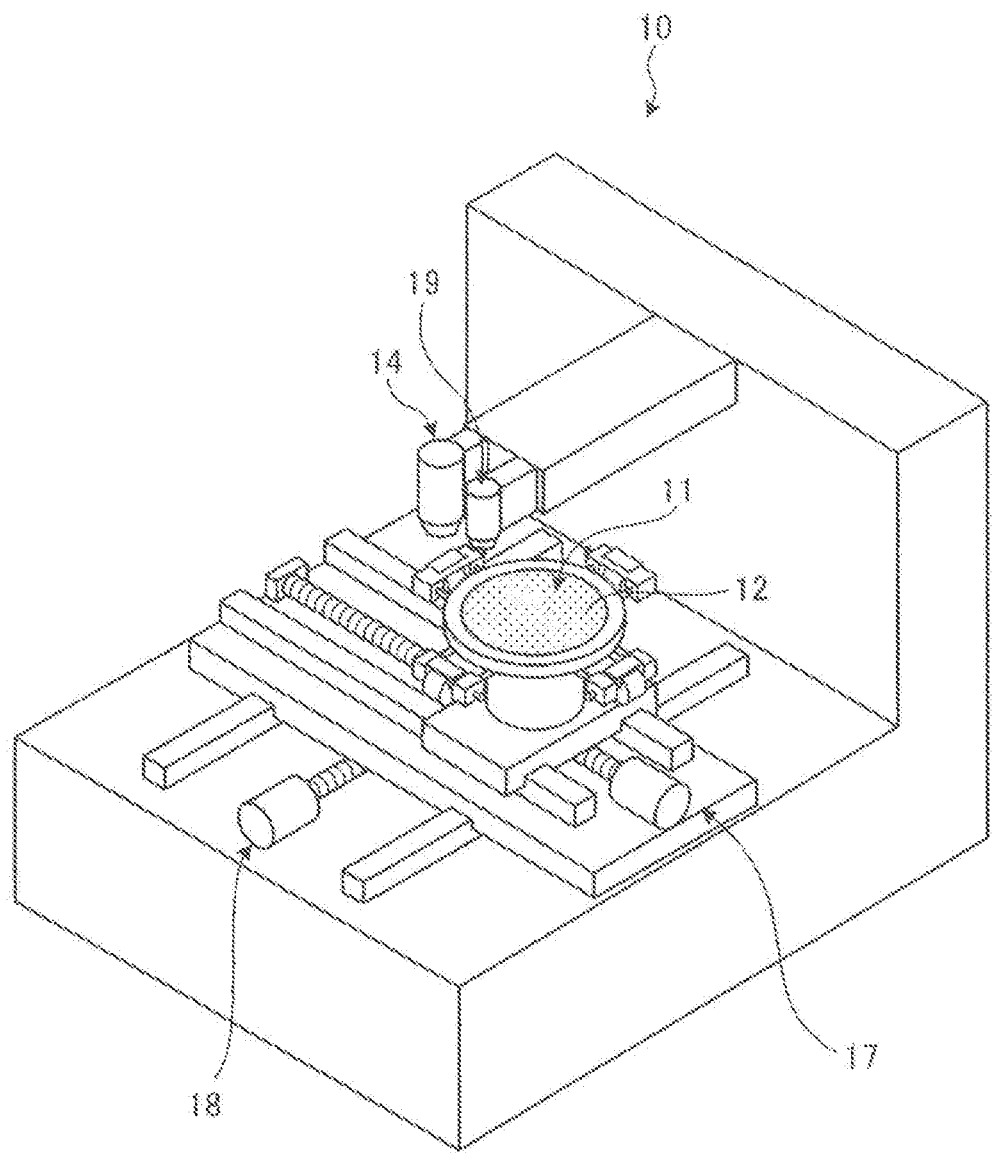
FIG. 3 is a perspective view of a processing apparatus for performing a division start point forming step depicted in FIG. 2.
Figure 4:
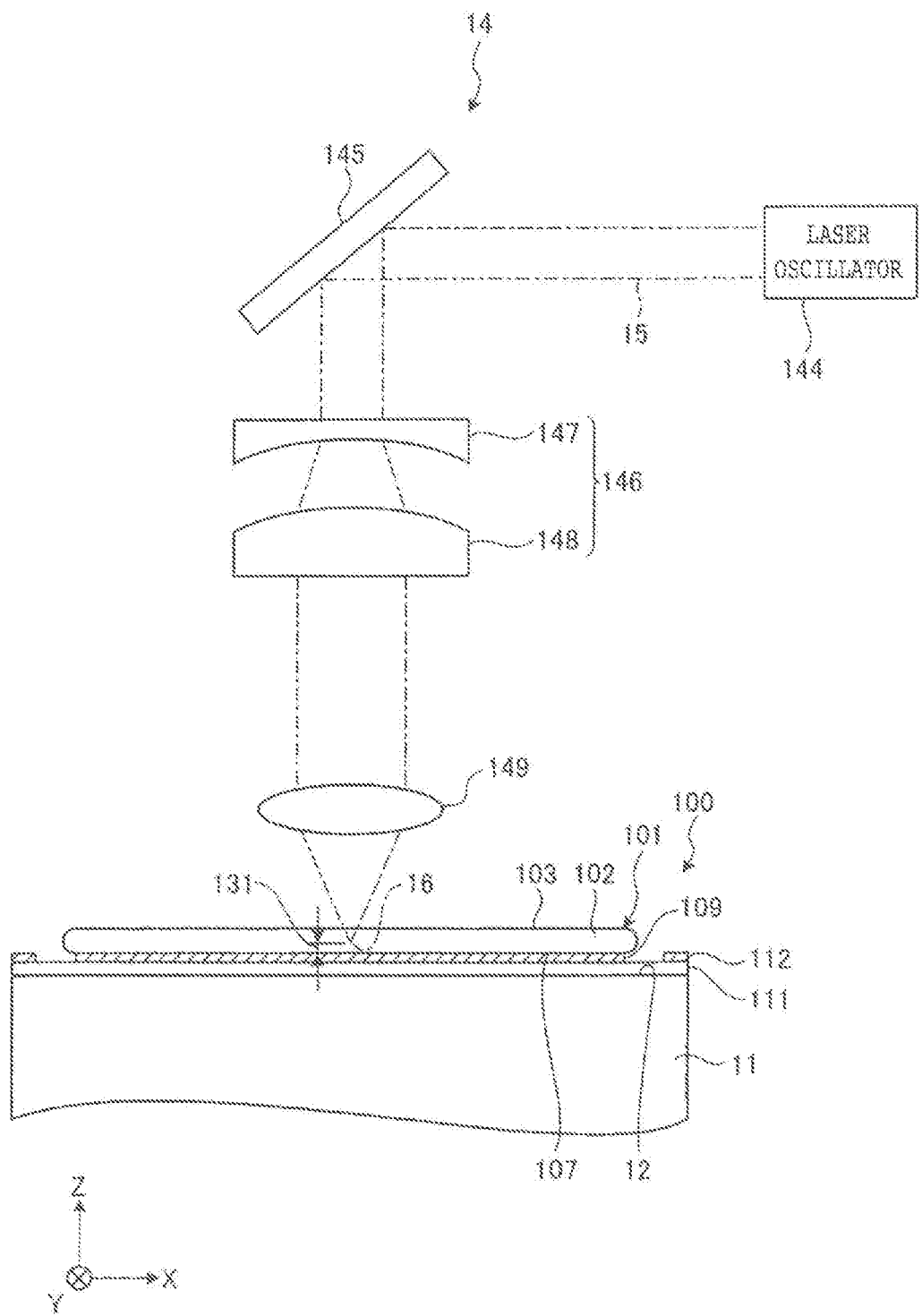
FIG. 4 is a schematic diagram depicting the configuration of a laser applying unit included in the processing apparatus depicted in FIG. 3.
Figure 5:
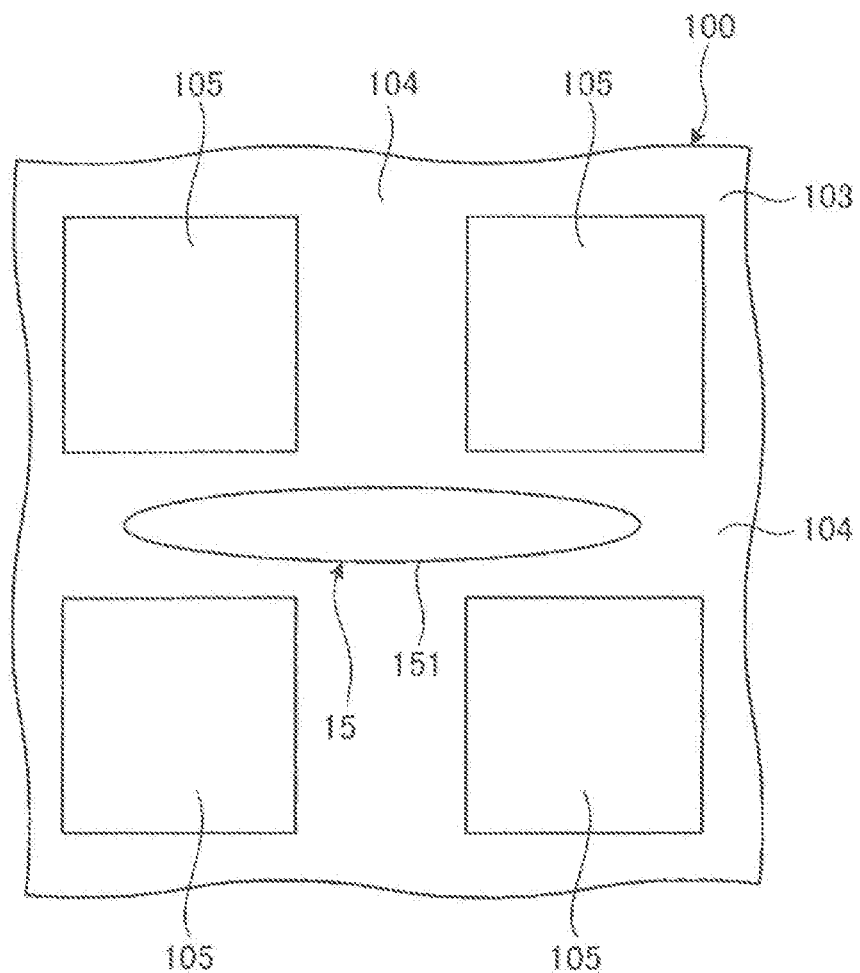
FIG. 5 is an enlarged plan view of an essential part of the workpiece unit, depicting the shape of a spot of a laser beam applied from the laser applying unit depicted in FIG. 4 to the workpiece unit.
Figure 6:
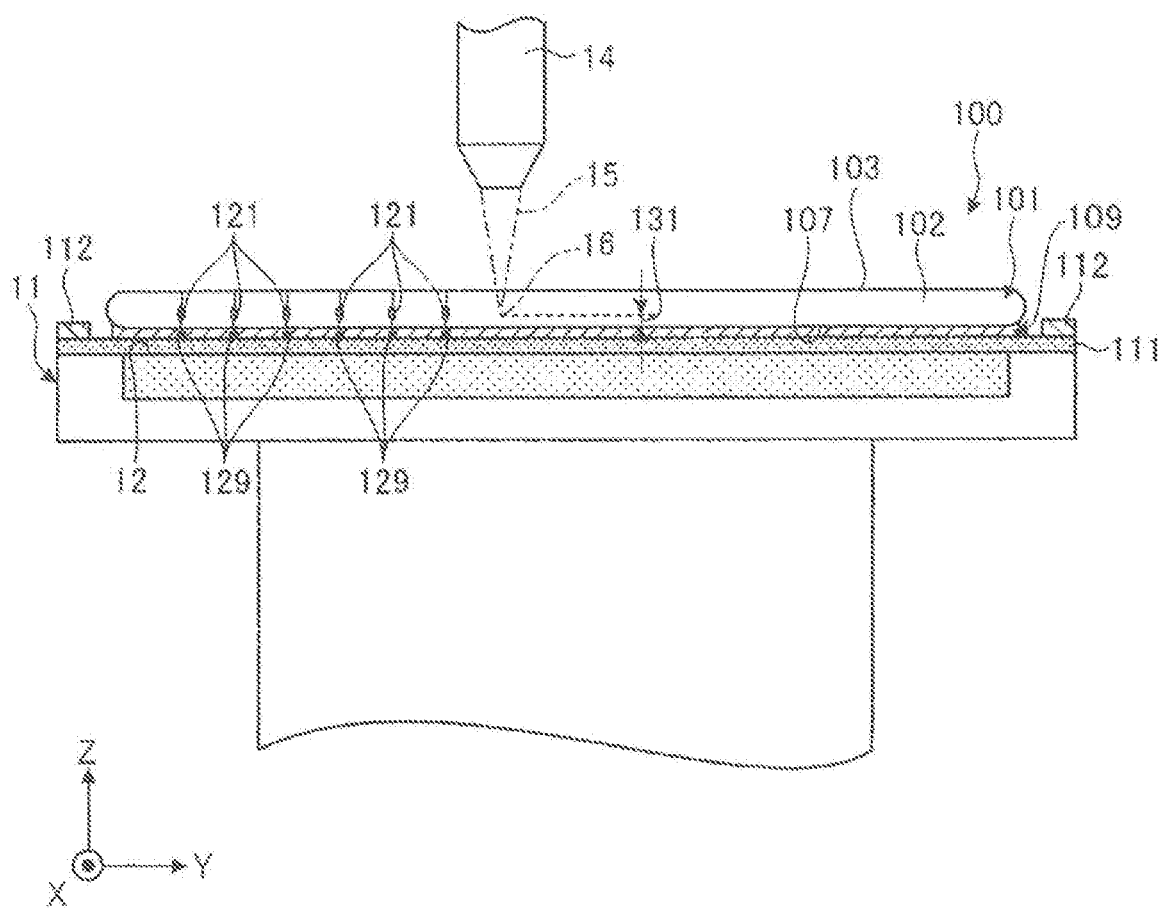
FIG. 6 is a sectional view for illustrating the division start point forming step.
Figure 7:
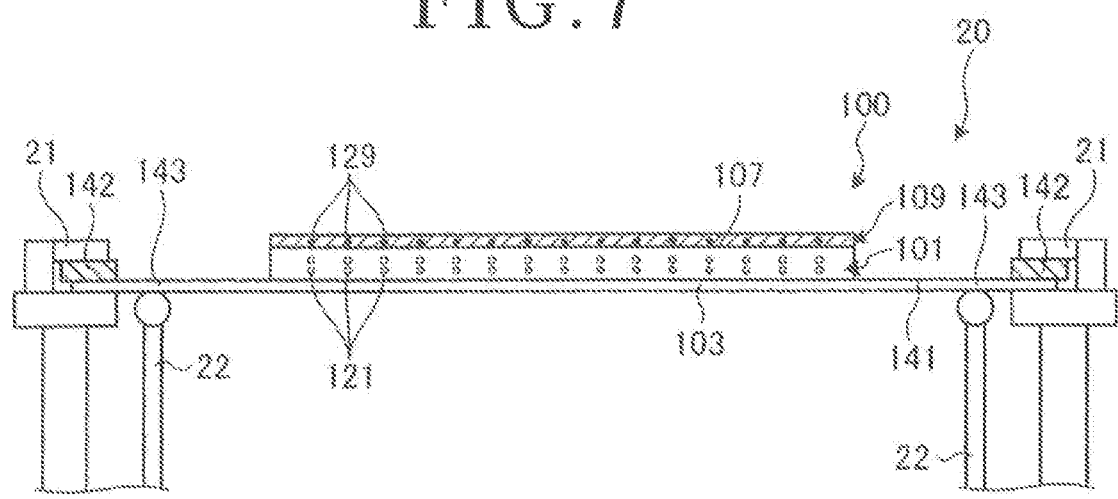
FIGS. 7 and 8 are sectional views for illustrating a dividing step depicted in FIG. 2.
Figure 8:
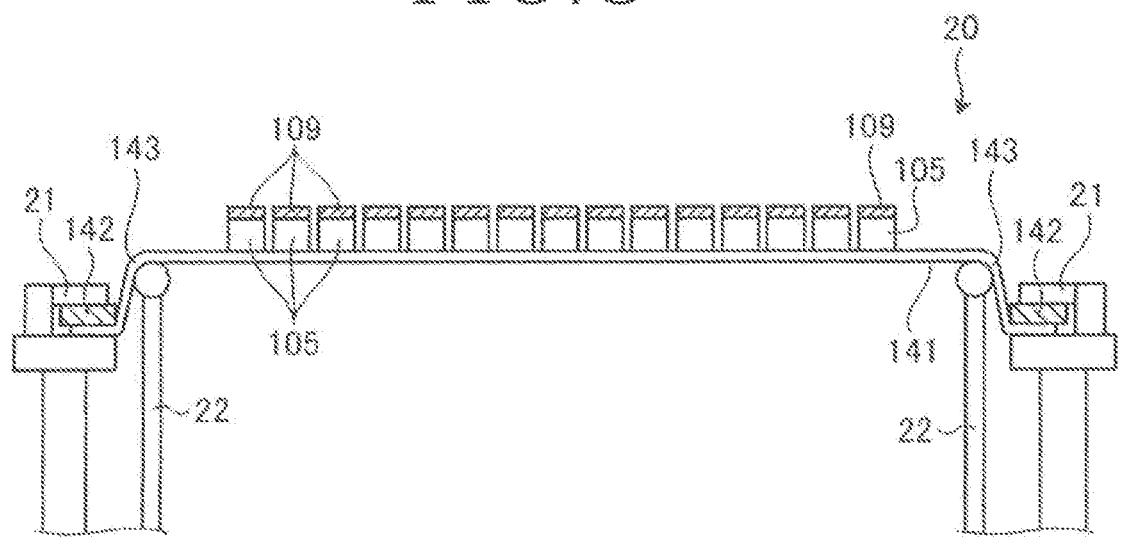

The workpiece processing method according to this preferred embodiment will now be described with reference to FIGS. 2 to 8. FIG. 2 is a flowchart depicting the workpiece processing method according to this preferred embodiment. FIG. 3 is a perspective view of a processing apparatus 10 for performing a division start point forming step ST12 depicted in FIG. 2. FIG. 4 is a schematic diagram depicting the configuration of a laser applying unit 14 included in the processing apparatus 10 depicted in FIG. 3. FIG. 5 is an enlarged plan view of an essential part of the workpiece unit 100, depicting the shape of a spot of a laser beam applied from the laser applying unit 14 depicted in FIG. 4 to the workpiece unit 100. FIG. 6 is a sectional view for illustrating the division start point forming step ST12 in FIG. 2. FIGS. 7 and 8 are sectional views for illustrating a dividing step ST14 depicted in FIG. 2. As depicted in FIG. 2, the workpiece processing method according to this preferred embodiment includes a holding step ST11, division start point forming step ST12, attaching step ST13, and dividing step ST14.

In the workpiece processing method according to this preferred embodiment, the holding step ST11 and the division start point forming step ST12 are performed by the processing apparatus 10 depicted in FIG. 3. As depicted in FIG. 3, the processing apparatus 10 includes a holding table 11 having a holding surface 12 for holding the workpiece unit 100 (the workpiece 101 and the additional member 109), a laser applying unit 14 for applying a laser beam 15 (see FIG. 6) toward the workpiece unit 100 (the workpiece 101 and the additional member 109) held on the holding table 11, an X moving unit 17 for moving the holding table 11 in an X direction as one direction in a horizontal plane (the X direction being depicted by an arrow X in FIG. 3), a Y moving unit 18 for moving the holding table 11 in a Y direction perpendicular to the X direction in the horizontal plane (the Y direction being depicted by an arrow Y in FIG. 3), an imaging unit 19 for imaging the workpiece unit 100 (the workpiece 101 and the additional member 109) held on the holding table 11, and a control unit (not depicted) for controlling each component mentioned above.

As depicted in FIG. 4, the laser applying unit 14 includes a laser oscillator 144 for oscillating a laser having a transmission wavelength to the substrate 102 of the workpiece 101 and emitting a laser beam 15, a mirror 145 for reflecting the laser beam 15 emitted from the laser oscillator 144 toward the workpiece 101 (the workpiece unit 100) held on the holding surface 12 of the holding table 11, a focusing lens 149 for focusing the laser beam 15 inside the workpiece 101, focal position adjusting means (not depicted) for moving the focal point 16 of the laser beam 15 in a Z direction perpendicular to both the X direction and the Y direction (the Z direction being depicted by an arrow Z in FIG. 4), and elliptical spot forming means 146 for forming the shape of a spot 151 (see FIG. 5) of the laser beam 15 on the front side 103 of the workpiece 101 into an elliptical shape.

In this preferred embodiment, the elliptical spot forming means 146 is located between the mirror 145 and the focusing lens 149 and is composed of a plano-concave cylindrical lens 147 and a plano-convex cylindrical lens 148. The plano-concave cylindrical lens 147 functions to linearly condensing the laser beam 15 reflected by the mirror 145. The plano-convex cylindrical lens 148 functions to convert the laser beam 15 emerging from the plano-concave cylindrical lens 147 into a collimated beam (parallel rays) having an elliptical spot shape 151.

In this preferred embodiment, as depicted in FIG. 5, the elliptical spot forming means 146 functions to form the elliptical spot shape 151 such that the elliptical spot shape 151 is formed along each division line 104 on the front side 103 of the workpiece 101 and that the major axis of the elliptical spot shape 151 extends in the X direction as a feeding direction where the workpiece 101 is fed.

The holding step ST11 is a step of holding the workpiece unit 100 on the holding table 11 of the processing apparatus 10 depicted in FIG. 3 in a condition where the back side 107 of the workpiece 101 is oriented downward, that is, the additional member 109 of the workpiece unit 100 is oriented downward.

The holding step ST11 will now be described more specifically. As depicted in FIG. 6, a circular protective tape 111 is attached to the additional member 109 of the workpiece unit 100 so as to protect the additional member 109, and an annular ring frame 112 is attached to a peripheral portion of the circular protective tape 111 before holding the workpiece unit 100 on the holding table 11. The circular protective tape 111 has a diameter larger than that of the workpiece unit 100 (the workpiece 101 and the additional member 109). Accordingly, the circular protective tape 111 is attached at its central portion to the additional member 109 of the workpiece unit 100. The annular ring frame 112 has a circular inside opening having a diameter larger than that of the workpiece unit 100 and smaller than that of the circular protective tape 111. Accordingly, the annular ring frame 112 is attached to the peripheral portion of the circular protective tape 111 so as to surround the workpiece unit 100. After attaching the protective tape 111 to the workpiece unit 100 and attaching the ring frame 112 to the protective tape 111 as mentioned above, the additional member 109 of the workpiece unit 100 is held under suction through the protective tape 111 on the holding surface 12 of the holding table 11 as depicted in FIG. 6. Although not depicted, the holding table 11 of the processing apparatus 10 is connected to a vacuum source for producing a vacuum. Accordingly, the workpiece unit 100 can be held under suction through the protective tape 111 on the holding surface 12 of the holding table 11 by operating the vacuum source.

After performing the holding step ST11, the division start point forming step ST12 is performed as depicted in FIG. 6. The division start point forming step ST12 is a step of applying the laser beam 15 to the front side 103 of the workpiece 101 in a condition where the focal point 16 of the laser beam 15 is set inside the workpiece 101, the laser beam 15 having a transmission wavelength to the workpiece 101, thereby forming a modified layer 121 inside the workpiece 101 and also forming a division start point 129 inside the additional member 109 due to the leakage of the laser beam 15 from the focal point 16 toward the back side 107 of the workpiece 101.

The division start point forming step ST12 will now be described more specifically. Prior to applying the laser beam 15, the workpiece unit 100 (the workpiece 101 and the additional member 109) held on the holding table 11 is imaged by operating the imaging unit 19. According to an image obtained by the imaging unit 19, alignment is performed to set the relative position between the workpiece unit 100 (the workpiece 101 and the additional member 109) and the laser applying unit 14.

After performing the alignment as mentioned above, the focal point 16 of the laser beam 15 to be applied from the laser applying unit 14 is set inside the workpiece 101 by operating the focal position adjusting means. Thereafter, the laser applying unit 14 is operated to apply the laser beam 15 to the front side 103 of the workpiece 101. As applying the laser beam 15, the X moving unit 17 is operated to move the holding table 11 holding the workpiece unit 100 (the workpiece 101 and the additional member 109) in the X direction, so that the laser beam 15 is applied along a predetermined one of the division lines 104 extending in the X direction.

As a result, the modified layer 121 is linearly formed inside the workpiece 101 at the depth where the focal point 16 is set. That is, the linear modified layer 121 is formed inside the workpiece 101 so as to extend along the predetermined division line 104. At the same time, the laser beam 15 focused at the focal point 16 leaks from the focal point 16 toward the back side 107 of the workpiece 101, thereby linearly forming the division start point 129 inside the additional member 109 along this predetermined division line 104. At this time, the division start point 129 is formed at the depth from the back side 107 of the workpiece 101 opposite to the vertical position of the modified layer 121 with respect to the back side 107.

After linearly forming the modified layer 121 and the division start point 129 along the predetermined division line 104, the Y moving unit 18 is operated to move the holding table 11 in the Y direction as an indexing direction by the pitch of the division lines 104. Thereafter, the laser beam 15 is similarly applied to form a plurality of similar modified layers 121 and division start points 129 as depicted in FIG. 6. In FIG. 6, there is depicted a midway condition such that six modified layers 121 and six division start points 129 are linearly formed along six division lines 104 extending in the X direction (the six division lines 104 being equally spaced in the Y direction from the −Y side, that is, from the tail side of the arrow Y in FIG. 6), in which all the modified layers 121 are formed inside the workpiece 101 at the same depth from the front side 103 of the workpiece 101, and all the division start points 129 are formed inside the additional member 109 at the same depth from the back side 107 of the workpiece 101. In this manner, the plural modified layers 121 are linearly formed inside the workpiece 101 along all the crossing division lines 104, and the plural division start points 129 are linearly formed inside the additional member 109 along all the crossing division lines 104.

Preferably, in this preferred embodiment, the laser beam 15 is applied along each division line 104 in a condition where the focal point 16 of the laser beam 15 is set at a first predetermined depth from the front side 103 of the workpiece 101, and next applied along each division line 104 in a condition where the focal point 16 is set at a second predetermined depth from the front side 103, the second predetermined depth being less than the first predetermined depth. That is, the laser beam 15 is applied along each division line 104 in two passes at different depths, thereby linearly forming two modified layers 121 along each division line 104 at the first and second predetermined depths inside the workpiece 101. At the same time in applying the laser beam 15 along each division line 104 in a condition where the focal point 16 is set at the first predetermined depth, the division start point 129 is linearly formed along each division line 104 inside the additional member 109 due to the leakage of the laser beam 15 from the focal point 16 toward the back side 107 of the workpiece 101. However, the number of passes along each division line 104 where the laser beam 15 is to be applied is not limited to two mentioned above, but it may be suitably changed according to the thickness of the workpiece 101 and the conditions for application of the laser beam 15, for example.

In FIG. 6, reference numeral 131 denotes a distance (corresponding to the first predetermined depth) from the back side 107 of the workpiece 101 to the focal point 16 of the laser beam 15 in the direction along the thickness of the workpiece 101. Preferably, this distance 131 is set to a minimum value, that is, the focal point 16 is set at a position as near as possible to the additional member 109. In other words, this distance 131 is set as a distance where the leakage of the laser beam 15 focused at the focal point 16 can apply heat to the additional member 109, thereby melting the additional member 109 to modify the same, so that the division start point 129 can be formed inside the additional member 109 at the position directly below each division line 104.

After performing the division start point forming step ST12, the protective tape 111 and the ring frame 112 as mounted to the workpiece unit 100 (the workpiece 101 and the additional member 109) in the holding step ST11 are removed. That is, the protective tape 111 is peeled from the additional member 109 of the workpiece unit 100.

After removing the protective tape 111 and the ring frame 112 from the workpiece unit 100, the attaching step ST13 is performed as depicted in FIG. 7. That is, the attaching step ST13 is a step of attaching the front side 103 of the workpiece 101 to an expandable tape 141 after performing the division start point forming step ST12.

The attaching step ST13 will now be described more specifically. As depicted in FIG. 7, the expandable tape 141 having a circular shape is attached at its central portion to the front side 103 of the workpiece 101, and an annular ring frame 142 is attached to a peripheral portion of the circular expandable tape 141. More specifically, the circular expandable tape 141 is capable of being expanded and contracted. The circular expandable tape 141 has a diameter larger than that of the workpiece unit 100 (the workpiece 101 and the additional member 109). Accordingly, the workpiece unit 100 is attached to the central portion of the circular expandable tape 141. The expandable tape 141 has an adhesive layer, which is attached to the front side 103 of the workpiece 101. The ring frame 142 is also attached to the adhesive layer of the expandable tape 141 at its peripheral portion. The ring frame 142 has a circular inside opening having a diameter larger than that of the workpiece unit 100 and smaller than that of the circular expandable tape 141.

After performing the attaching step ST13, the dividing step ST14 is performed by using a dividing apparatus 20 depicted in FIGS. 7 and 8. As depicted in FIGS. 7 and 8, the dividing apparatus 20 includes a frame fixing unit 21 for fixing the ring frame 142 attached to the peripheral portion of the expandable tape 141, a tape expanding unit 22 for expanding the expandable tape 141, and a control unit (not depicted) for controlling these units 21 and 22. The frame fixing unit 21 and the tape expanding unit 22 are circular as viewed in plan. That is, these units 21 and 22 are cylindrical members. The frame fixing unit 21 and the tape expanding unit 22 are coaxially arranged in such a manner that the tape expanding unit 22 is surrounded by the frame fixing unit 21. That is, the tape expanding unit 22 has an outer diameter smaller than the inner diameter of the frame fixing unit 21. The inner diameter of the tape expanding unit 22 is larger than the diameter of the workpiece unit 100.

As depicted in FIGS. 7 and 8, the dividing step ST14 is a step of expanding the expandable tape 141 to thereby divide the workpiece 101 and the additional member 109 along the modified layers 121 and the division start points 129 formed along all the crossing division lines 104, thereby dividing the workpiece unit 100 at a time.

The dividing step ST14 will now be described more specifically. As depicted in FIG. 7, the ring frame 142 supporting the workpiece unit 100 through the expandable tape 141 is fixed by the frame fixing unit 21 so that the upper surface of the ring frame 142 is held by the frame fixing unit 21 in a condition where the additional member 109 of the workpiece unit 100 attached to the expandable tape 141 is oriented upward. Thereafter, as depicted in FIG. 8, the tape expanding unit 22 is relatively moved upward in a vertical direction along the axis thereof with respect to the frame fixing unit 21, so that an annular exposed area 143 of the expandable tape 141 as defined between the inner circumference of the ring frame 142 and the outer circumference of the workpiece unit 100 is depressed upward by the upper end of the tape expanding unit 22 in a direction perpendicular to the front side 103 of the workpiece 101, so that this annular exposed area 143 of the expandable tape 141 is expanded.

By the expansion of the expandable tape 141, an external force is applied to both the modified layers 121 and the division start points 129 in the radial direction of the workpiece unit 100 at the same time and to substantially the same extent, in which the direction of the external force is the same as the direction of expansion of the expandable tape 141, so that the devices 105 are moved away from each other. That is, the workpiece 101 starts being broken at the modified layers 121 formed along all the division lines 104, and the additional member 109 also starts being broken at the division start points 129 formed along all the division lines 104. As a result, in the dividing step ST14, the workpiece 101 and the additional member 109 of the workpiece unit 100 are divided along all the division lines 104 to thereby obtain the individual devices 105 (the individual device chips) with the individual parts divided from the additional member 109.

As described above, in the division start point forming step ST12 of the workpiece processing method according to this preferred embodiment, the spot shape 151 of the laser beam 15 on the front side 103 of the workpiece 101 is formed into an elliptical shape having a major axis extending in the X direction, and the laser beam 15 having a transmission wavelength to the workpiece 101 is applied to the front side 103 of the workpiece 101 in a condition where the focal point 16 is set inside the workpiece 101, thereby forming the modified layers 121 inside the workpiece 101 and also forming the division start points 129 inside the additional member 109 due to the leakage of the laser beam 15 from the focal point 16 toward the back side 107 of the workpiece 101. Accordingly, by applying an external force to the modified layers 121 and the division start points 129 at the same time in the direction where the devices 105 are moved away from each other, the workpiece 101 and the additional member 109 different in material from each other can be divided along all the division lines 104 at a time. Thus, the workpiece processing method according to this preferred embodiment has an effect such that it is possible to efficiently divide the workpiece unit 100 composed of the workpiece 101 and the additional member 109 formed on the back side 107 of the workpiece 101, the additional member 109 being different in material from the workpiece 101.

Further, as described above, in the workpiece processing method according to this preferred embodiment, the spot shape 151 of the laser beam 15 on the front side 103 of the workpiece 101 is formed into an elliptical shape having a major axis extending in the X direction, and the laser beam 15 is applied to the workpiece 101 in a condition where the focal point 16 is set at the position above the back side 107 of the workpiece 101 by the distance 131 mentioned above. In the case that the spot shape of the laser beam 15 is a circular shape, there is a possibility that the laser beam 15 leaked from the focal point 16 toward the back side 107 of the workpiece 101 may be applied to the outside of each division line 104 beyond the width thereof under each division line 104. To the contrary, in the workpiece processing method according to this preferred embodiment, the spot shape of the laser beam 15 is an elliptical shape elongated in the X direction, so that the spread of the laser beam 15 in the Y direction perpendicular to the X direction can be reduced. Accordingly, the laser beam 15 leaked from the focal point 16 toward the back side 107 of the workpiece 101 is applied to the inside of each division line 104 within the width thereof under each division line 104, that is, applied to the position directly below each division line 104. Further, the modified layer 121 and the division start point 129 can be simultaneously formed by applying the laser beam 15 along each division line 104 in one pass according to this preferred embodiment. Accordingly, as compared with the prior art method in which the workpiece 101 is first divided along each division line 104 and the additional member 109 is next divided along each division line 104, there is a reduced deviation between a break line formed by breaking the workpiece 101 along the modified layer 121 and a break line formed by breaking the additional member 109 along the division start point 129 according to this preferred embodiment. That is, in the case that the workpiece 101 and the additional member 109 are separately divided as in the prior art, there is a possibility that the break line formed by breaking the workpiece 101 along the modified layer 121 may deviate from the break line formed by breaking the additional member 109 along the division start point 129. However, such a line deviation can be greatly suppressed according to this preferred embodiment.

The workpiece processing method according to this preferred embodiment further includes the attaching step ST13 of attaching the front side 103 of the workpiece 101 to the expandable tape 141 after performing the division start point forming step ST12 and the dividing step ST14 of expanding the expandable tape 141 to thereby divide the workpiece 101 and the additional member 109 along the modified layers 121 and the division start points 129 at one time. Accordingly, by expanding the expandable tape 141 attached to the workpiece unit 100, an external force can be simultaneously applied to both the modified layers 121 and the division start points 129 in the direction where the devices 105 are moved away from each other. As a result, the workpiece 101 and the additional member 109 different in material from each other can be suitably divided along all the division lines 104 at one time.

In the workpiece processing method according to this preferred embodiment, a DAF or a metal film is used as the additional member 109. In the prior art, a DAF or a metal film formed on the workpiece 101 must be divided separately from the dividing step of dividing the workpiece 101. To the contrary, according to this preferred embodiment, the DAF or the metal film formed on the workpiece 101 can be efficiently divided in the dividing step of dividing the workpiece 101. That is, the workpiece unit 100 composed of the workpiece 101 and the DAF or the metal film formed on the workpiece 101 can be divided at one time.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece processing method for processing a workpiece unit composed of a workpiece having a front side and a back side opposite to the front side and an additional member formed on the back side of the workpiece, the additional member being different in material from the workpiece, the workpiece processing method comprising:
   a holding step of holding the workpiece unit on a holding table in a condition where the additional member of the workpiece unit is opposed to the holding table; and
   a division start point forming step of applying a laser beam to the front side of the workpiece of the workpiece unit in a condition where the focal point of the laser beam is set inside the workpiece after performing the holding step, the laser beam having a transmission wavelength to the workpiece, thereby forming a modified layer inside the workpiece and simultaneously forming a division start point inside the additional member due to the leakage of the laser beam from the focal point toward the back side of the workpiece,
   wherein the division start point inside the additional member is a modified portion resulting from heat from the leakage of the laser beam.

2. The workpiece processing method according to claim 1, further comprising:
   an attaching step of attaching the front side of the workpiece to an expandable tape after performing the division start point forming step; and
   a dividing step of expanding the expandable tape to thereby divide the workpiece and the additional member along the modified layer and the division start point at one time.

3. The workpiece processing method according to claim 1, wherein the additional member includes a die attach film.

4. The workpiece processing method according to claim 1, wherein the additional member includes a metal film.

5. The workpiece processing method according to claim 1, wherein the modified portion of the division start point comprises a melted portion.

6. A workpiece processing method for processing a workpiece unit composed of a workpiece having a front side and a back side opposite to the front side and an additional member formed on the back side of the workpiece, the additional member being different in material from the workpiece, the workpiece processing method comprising:
   a holding step of holding the workpiece unit on a holding table in a condition where the additional member of the workpiece unit is opposed to the holding table;
   a first division start point forming step of applying a laser beam focused to a first single focal point to the front side of the workpiece of the workpiece unit in a condition where the first single focal point of the laser beam is set inside the workpiece after performing the holding step, the laser beam having a transmission wavelength to the workpiece; and
   a second division start point forming step of applying a second laser beam focused to a second single focal point to the front side of the workpiece of the workpiece unit in a condition where the second single focal point of the second laser beam is set inside the workpiece after performing the first division start point forming step, wherein the second single focal point is at a different depth with respect to the front side of the workpiece than the first single focal point, and
   wherein a combination of the first division start forming step and the second division start forming step results in the formation of a modified layer inside the workpiece and the simultaneous formation of a division start point inside the additional member due to the leakage of the laser beam from the first single focal point toward the back side of the workpiece.

7. The workpiece processing method according to claim 6, wherein the depth of second single focal point, with respect to the front side of the workpiece, is less than the depth of first single focal point, with respect to the front side of the workpiece.

8. The workpiece processing method according to claim 6, further comprising:
   an attaching step of attaching the front side of the workpiece to an expandable tape after performing the second division start point forming step; and
   a dividing step of expanding the expandable tape to thereby divide the workpiece and the additional member along the modified layer and the division start point at one time.

9. The workpiece processing method according to claim 6, wherein the additional member includes a die attach film.

10. The workpiece processing method according to claim 6, wherein the additional member includes a metal film.

11. A workpiece processing method for processing a workpiece unit composed of a workpiece having a front side and a back side opposite to the front side and an additional member formed on the back side of the workpiece, the additional member being different in material from the workpiece, the workpiece processing method comprising:
- a holding step of holding the workpiece unit on a holding table in a condition where the additional member of the workpiece unit is opposed to the holding table;
- a first division start point forming step of applying a laser beam focused to a first focal point to the front side of the workpiece of the workpiece unit in a condition where the first focal point of the laser beam is set inside the workpiece after performing the holding step, the laser beam having a transmission wavelength to the workpiece; and
- a second division start point forming step of applying a second laser beam focused to a second focal point to the front side of the workpiece of the workpiece unit in a condition where the second focal point of the second laser beam is set inside the workpiece after performing the first division start point forming step, wherein the second focal point is at a different depth with respect to the front side of the workpiece than the first focal point, and
- wherein a combination of the first division start forming step and the second division start forming step results in the formation of a modified layer inside the workpiece and the simultaneous formation of a division start point inside the additional member due to the leakage of the laser beam from the first focal point toward the back side of the workpiece.

12. The workpiece processing method according to claim 11, wherein the depth of second focal point, with respect to the front side of the workpiece, is less than the depth of first focal point, with respect to the front side of the workpiece.

13. The workpiece processing method according to claim 11, further comprising:
- an attaching step of attaching the front side of the workpiece to an expandable tape after performing the second division start point forming step; and
- a dividing step of expanding the expandable tape to thereby divide the workpiece and the additional member along the modified layer and the division start point at one time.

14. The workpiece processing method according to claim 11, wherein the additional member includes a die attach film.

15. The workpiece processing method according to claim 11, wherein the additional member includes a metal film.

16. The workpiece processing method according to claim 6, wherein the division start point inside the additional member is a modified portion resulting from heat from the leakage of the laser beam.

17. The workpiece processing method according to claim 11, wherein the division start point inside the additional member is a modified portion resulting from heat from the leakage of the laser beam.

18. The workpiece processing method according to claim 1, wherein during the division start point forming step, the laser beam is focused to a single focal point and the single focal point of the laser beam is set inside the workpiece.

19. The workpiece processing method according to claim 1, wherein the laser beam has an elliptical spot shape as viewed from the front side of the workpiece.

20. The workpiece processing method according to claim 19, wherein during the division start point forming step, the laser beam and the workpiece are moved relative to each other in an x-direction along a division line, and further wherein the elliptical spot shape has a major axis extending in the x-direction.

* * * * *